US006772022B1

(12) United States Patent
Farrow et al.

(10) Patent No.: US 6,772,022 B1
(45) Date of Patent: Aug. 3, 2004

(54) METHODS AND APPARATUS FOR PROVIDING SAMPLE RATE CONVERSION BETWEEN CD AND DAT

(75) Inventors: Cecil William Farrow, Highlands, NJ (US); Yhean-Sen Lai, Warren, NJ (US); Kannan Rajamani, Tinton Falls, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/335,277

(22) Filed: Jun. 17, 1999

(51) Int. Cl.$^7$ .......................... G06F 17/00; G10L 19/00
(52) U.S. Cl. ........................................ 700/94; 704/500
(58) Field of Search ............................ 700/94; 704/500

(56) References Cited

U.S. PATENT DOCUMENTS 5,943,427 A * 8/1999 Massie et al.

OTHER PUBLICATIONS

C.W. Farrow, "A Continuously Variable Digital Delay Element," ISCAS' 88, CH2458–8/88/0000–2641, pp. 2641–2646.*
Richard G. Lyons, Understanding Digital Signal Processing, 2001, A Prentice Hall PTR, pp. 314–315.*
S. Park et al., "A Novel Structure for Real–Time Digital Sample–Rate Converters with Finite Precision Error Analysis," pp. 3613–3616, ICASSP, 1991.
S. Park, "A Real–Time Method for Sample–Rate Conversion from CD to DAT," Proc. IEEE Int. Conf. Consumer Electronics, pp. 360–361, Chicago, IL, Jun. 18–20, 1990.
C.W. Farrow, "A Continuously Variable Digital Delay Element," ISCAS'88, CH2458–8/88/0000–2641, pp. 2641–2646, copyright 1988 IEEE.
Y. Neuvo et al., "Interpolated Finite Impulse Response Filters," IEEE Transactions on Acoustics, Speech and Signal Processing, vol. ASSP–32, No. 3, pp. 563–570, Jun. 1984.

* cited by examiner

*Primary Examiner*—F. W. Isen
*Assistant Examiner*—Elizabeth McChesney

(57) ABSTRACT

A method of converting between a sampling rate associated with a first audio format and a second audio format includes up-sampling an input signal sampled at the sample rate associated with the first audio format. Then, the up-sampled signal is filtered as a function of a fractional delay to generate an output signal sampled at the sample rate associated with the second audio format. The fractional delay is computed from the sample rates associated with the first and second audio formats. In one embodiment, the sample rates that are converted between are associated with a compact disc format having a sample rate of about 44.1 kHz and a digital audio tape format having a sample rate of about 48 kHz. In such case, the input samples are preferably up-sampled by a factor of two and the samples are then preferably filtered in accordance with a third order six taps coefficient finite impulse response filtering technique. The methodology of the present invention permits sample rate conversion from the CD format to the DAT format and from the DAT format to the CD format without changing filter coefficients.

29 Claims, 6 Drawing Sheets

METHODS AND APPARATUS FOR PROVIDING SAMPLE RATE CONVERSION BETWEEN CD AND DAT

FIELD OF THE INVENTION

The invention relates to sample rate conversion techniques and, more particularly, to methods and apparatus for converting between a compact disc sample rate and a digital audio tape sample rate.

BACKGROUND OF THE INVENTION

There exist several different algorithms for converting from a first sample rate, e.g., a compact disc (CD) sample rate of 44.1 KHz, to a second sample rate, e.g., a digital audio tape (DAT) sample rate of 48 kHz. Examples of such known techniques are described in: S. Park, "A Real-Time Method for Sample-Rate Conversion from CD to DAT," *Proc. IEEE Int. Conf. Consumer Electronics*, pp. 360–361, Chicago, Ill., Jun. 18–20, 1990; S. Park et al., "A Novel Structure for Real-Time Digital Sample-Rate Converters with Finite Precision Error Analysis," pp. 3613–3616, ICASSP, 1991; S. Cucchi et al., "DSP Implementation of Arbitrary Sampling Frequency Conversion for High Quality Sound Application," pp. 3609–3612, ICASSP, 1991; and J. O. Smith et al., "A Flexible Sampling Rate Conversion Method", Proc. ICAAP, 1984. It is essential to have a good sampling rate converter to change and synchronize the two different sampling rates without losing any of the useful information in the original digital signal being sampled. Some conventional sampling rate conversion techniques are described below.

A simple approach shown in FIG. 1 provides for converting a digital input signal into an analog signal in a digital-to-analog (D/A) converter 10 and then re-sampling the analog signal into the desired sampling rate in analog-to-digital (A/D) converter 14. A low-pass filter 12 interposed between the D/A converter 10 and the A/D converter 14 aids in reconstructing the analog signal. However, it is known that the analog low-pass filter 12, also called the analog reconstruction (anti-aliasing) filter, is extremely expensive and difficult to implement. The harmonic and noise distortion that occurs in the conversion from D/A and A/D also degrades overall performance.

Another conventional technique has been popularly used for digital sampling rate conversion in a fixed ratio M/N scenario, where M and N are both positive integers. FIG. 2 illustrates such an approach which employs a 1:M interpolator 16, a digital low-pass filter 18 and an N:1 decimator 20. The values M and N are determined by the ratio of output sampling rate to input sampling rate. This approach can be used in practice when the integers M and N are manageable numbers, typically less than 10. Thus, the input samples are first interpolated up by a factor M, passed through the digital low-pass filter and then decimated down by a factor N. In the application of sampling rate conversion from CD to DAT, the M and N are 160 and 147, respectively. However, attempting to implement CD to DAT sample rate conversion in this manner in a digital signal processor (DSP) requires an extremely large number of MIPS (million instructions per second). Hence, this method is not realistic for the application of sample rate conversion from CD to DAT.

The technique described in the above-mentioned S. Park articles uses the sinc function as shown in equation (1) below to generate a fractionally sampled signal for the sampling conversion from the CD rate to the DAT rate:

$$\text{sinc}(x) = \frac{\sin \pi(x)}{\pi(x)}. \tag{1}$$

This conventional approach is based on the fact that for every 147 input samples, 160 output samples are generated. In other words, at the transfer of every 160 output samples, the input and output sampling instants are synchronized again. Let $\tau_n$ be the current delay value for the output sampling index n and the current sampling index k, thus:

$$\tau_n = nT_{DAT} - kT_{CD} \tag{2}$$

where $T_{DAT}$ and $T_{CD}$ are the sampling periods of the DAT output signal and the CD input signal, respectively. In equation (1), there are 160 different delay values $\tau_n$ in total for $1 \leq n \leq 160$ and $1 \leq k \leq 147$. Each $\tau_n$ has its own associated 63-tap FIR coefficients to generate the corresponding output samples. This is illustrated in the sample rate converter of FIG. 3 which employs delays 22 and adder 24 to generate the output samples. In this implementation, the Blackman-Harris window (see D. F. Elliott, ed., "*Handbook of Digital Signal Processing Engineering Application*," Academic Press, 1987) has been used to optimize for maximum side-lobe attenuation to improve performance. One primary drawback of this approach is that it requires a very large table (memory space) to store the predetermined coefficients (i.e., 160×63 coefficients). In real-time DSP implementation, the size of data and program memory is often a key factor in the cost reduction.

Accordingly, there exists a need for a sample rate conversion technique that requires less memory capacity and/or less MIPS as compared to conventional sample rate conversion approaches.

SUMMARY OF THE INVENTION

The present invention provides improved methods and apparatus for sample rate conversion between a first audio format and a second audio format. In one aspect of the invention, a method of converting between a sampling rate associated with a first audio format and a second audio format includes up-sampling an input signal sampled at the sample rate associated with the first audio format. Then, the up-sampled signal is filtered as a function of a fractional delay to generate an output signal sampled at the sample rate associated with the second audio format. The fractional delay is computed from the sample rates associated with the first and second audio formats.

In one embodiment, the sample rates that are converted between are associated with a compact disc format having a sample rate of about 44.1 kHz and a digital audio tape format having a sample rate of about 48 kHz. In such case, the input samples are preferably up-sampled by a factor of two and the samples are then preferably filtered in accordance with a third order six taps coefficient finite impulse response filtering technique.

Advantageously, the methodology of the present invention permits sample rate conversion from the CD format to the DAT format and from the DAT format to the CD format without changing filter coefficients. Further, the present invention requires less memory capacity and/or less MIPS in a real-time DSP implementation as compared to conventional sample rate conversion approaches.

DETAILED DESCRIPTION OF PREFFERED EMBODIMENTS

The present invention provides a unique approach to sampling rate conversion between the CD rate and the DAT rate. However, it is to be appreciated that such techniques may be employed in sample rate conversion implementations other than ones involving both CD and DAT. Nonetheless, embodiments of the present invention will be described below in the context of sample rate conversion between CD and DAT.

A sample rate conversion apparatus of the invention comprises two unique structures: (i) a fractional delay filter module; and (ii) an up-sample by 2 (interpolator) module. Each module will be described in detail individually below followed by a description of an illustrative implementation and simulated results.

Fractional Delay Filter Module

Figure 1:
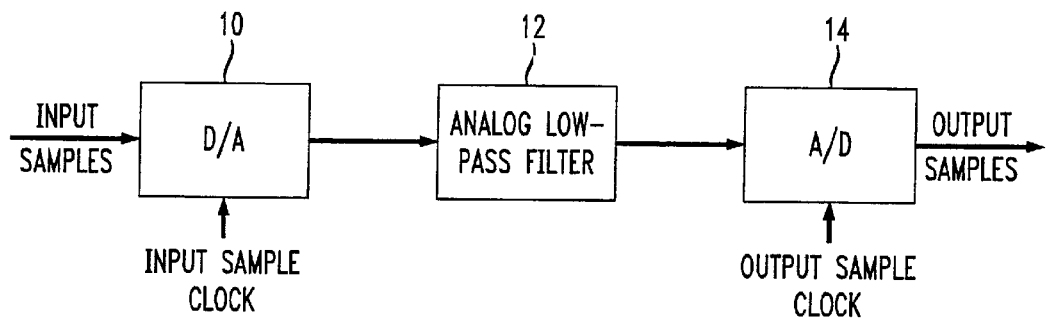
FIG. 1 is a block diagram of a first conventional sample rate conversion approach.
Figure 2:
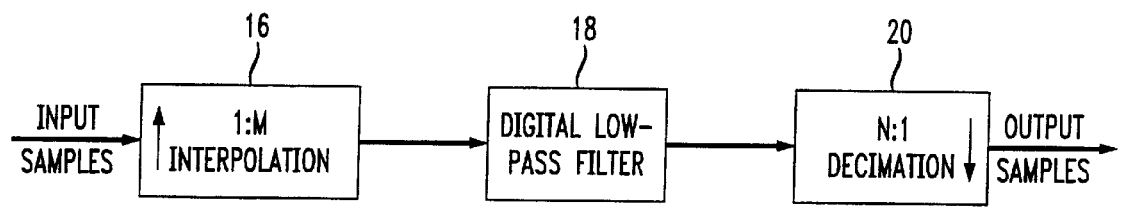
FIG. 2 is a block diagram of a second conventional sample rate conversion approach.
Figure 3:
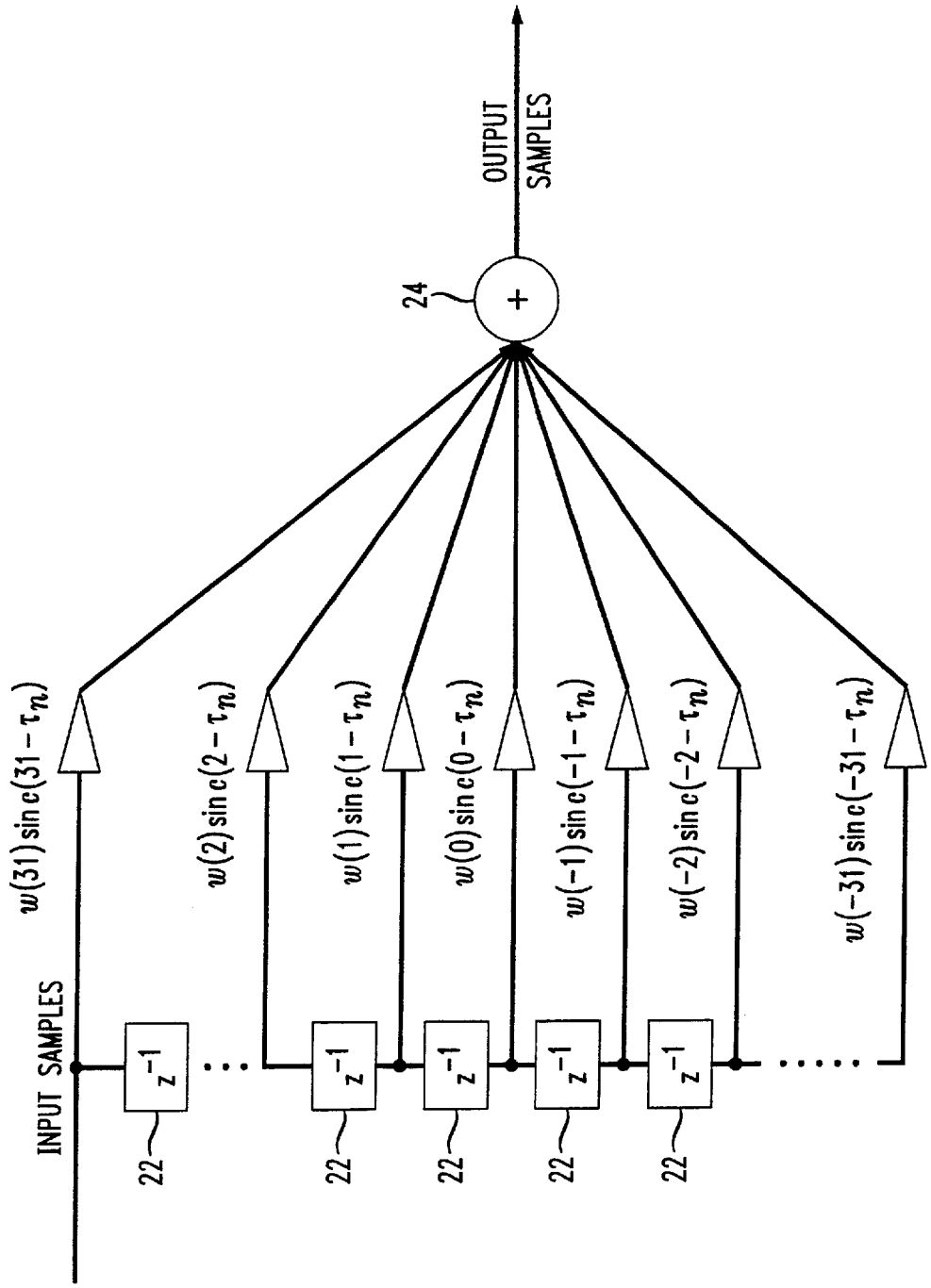
FIG. 3 is a block diagram of a third conventional sample rate conversion approach.
Figure 4:
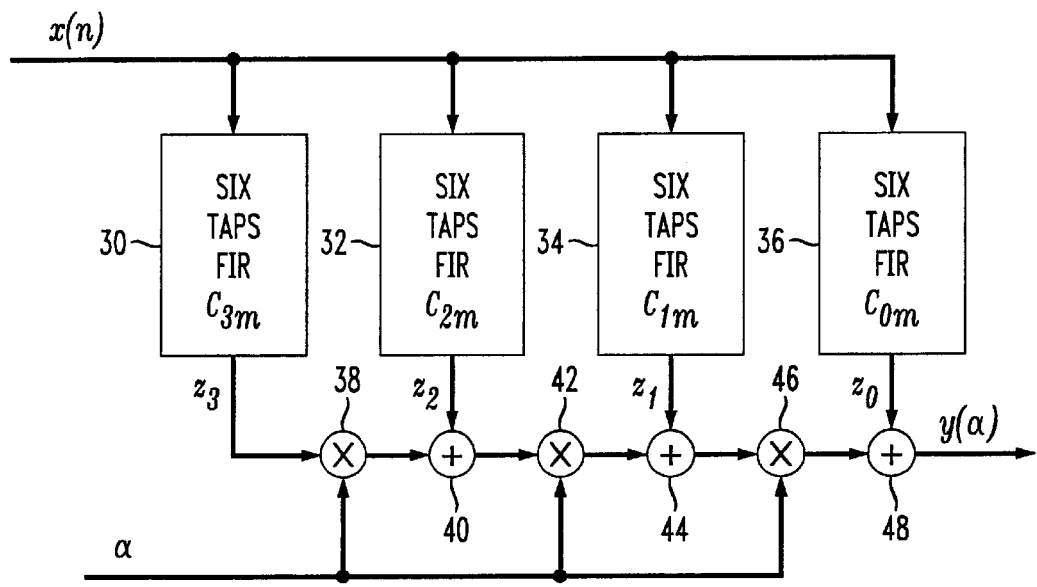
FIG. 4 is a block diagram of a fractional delay filter module according to an illustrative embodiment of the invention.

A fractional delay filter (FDF) module according to the invention uses a finite impulse response (FIR) filter whose tap coefficients are a function of the desired delay. The FDF module employs a unique decimation approach. An example of such a FDF module is shown in FIG. 4. Let T be the tap spacing and $\alpha T$ be the fractional delay. Then we have:

$$y(\alpha) = \sum_{k=0}^{N} x(n-k) C_k(\alpha), \quad (3)$$

where y is the output sample at the desired delay $\alpha$, $x(n)$ are the input samples, $C_k(\alpha)$ are the tap coefficients, and N is the order of the FIR for the FDF. In general, $C_k(\alpha)$ can be expressed as polynomials with order M in $\alpha$, as in equation (4) below:

$$C_k(\alpha) = \sum_{m=0}^{M} C_{km} \alpha^m. \quad (4)$$

With equation (4), we can rewrite equation (3) as follows:

$$z_m = \sum_{k=0}^{N} x(n-k) C_{km} \quad (5)$$

$$y(\alpha) = \sum_{m=0}^{M} \alpha^m z_m. \quad (6)$$

The FDF module for implementing equation (6) is illustrated in FIG. 4. This embodiment shows a structure of $3^{rd}$ order with six taps FIR (blocks 30 through 36). By employing multipliers 38, 42 and 46 and adders 40, 44 and 48, as shown, in conjunction with blocks 30 through 36, the FDF module yields the output sample y at the desired delay $\alpha$ from the input samples x(n) in accordance with equation (6).

Interpolator Module

Figure 5:
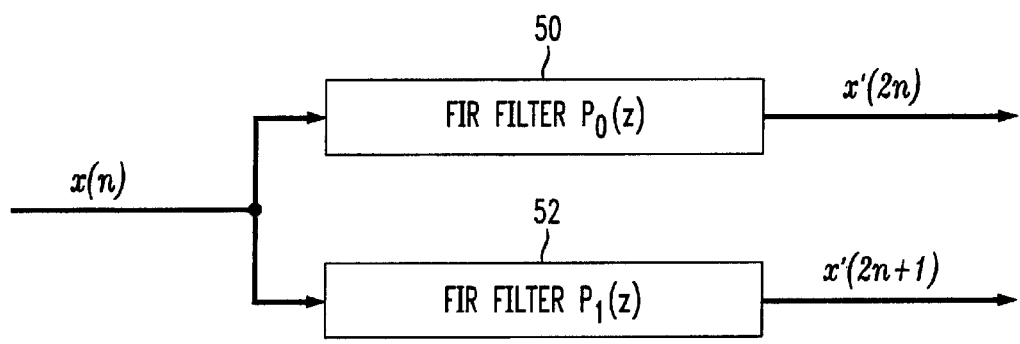
FIG. 5 is a block diagram of an interpolator module according to an illustrative embodiment of the invention.

The interpolator consists of a symmetric FIR to increase the sampling rate by a factor of two. An example of an interpolator structure is shown in FIG. 5. $P_0(z)$ and $P_1(z)$ are called the polyphase filters. These filters are generated from a prototype filter by decimation. The prototype filter is essentially a low pass filter having a cut-off of $$\frac{\Pi}{2}$$

where $\Pi$ is half of the sampling frequency. The prototype filter is designed using the well-known Remez exchange algorithm and the polyphase filters are the even and odd samples of the prototype filter. The filter $P_0(z)$ 50 filters the incoming signal and generates the even samples of the output and the filter $P_1(z)$ 52 generates the odd samples of the output. Each input sample is filtered by $P_0(z)$ and $P_1(z)$ to generate two sequential output samples. These are the output samples provided to the FDF module.

In the application of sampling rate conversion from CD to DAT, it is very difficult to design a good fractional delay filter in $3^{rd}$ order to maintain a high quality of performance. Hence, we employ an interpolator to interpolate the incoming samples up by a factor of two before passing the output signal through a fractional delay filter to generate the desired sampling rate. Also, the fractional delay filter coefficients need not be computed every time as a new sample enters into the delay line of the FDF. Only the $\alpha$ value changes as the new sample comes in.

Figure 6:
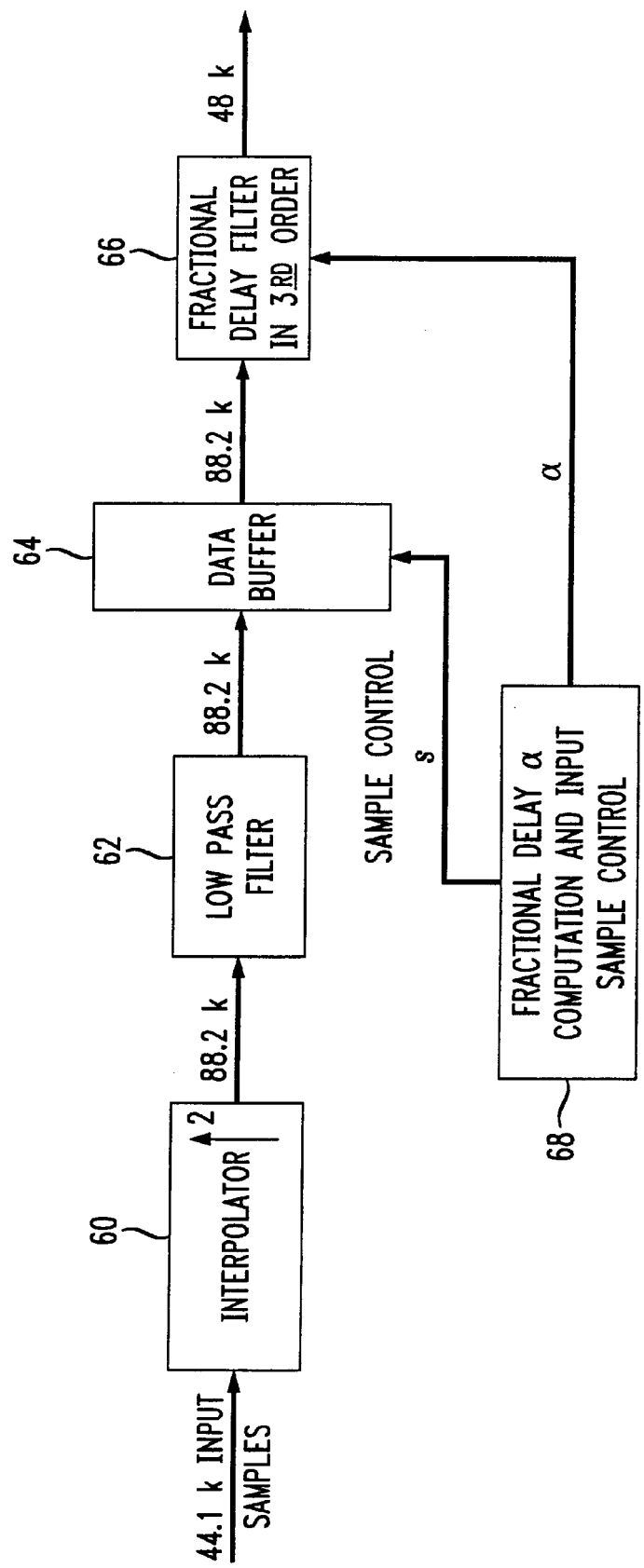
FIG. 6 is a block diagram of sample rate conversion apparatus according to an illustrative embodiment of the invention.

FIG. 6 illustrates a block diagram of CD to DAT sample rate conversion apparatus according to an embodiment of the invention. It is to be appreciated that the interpolator 60 may be implemented as shown in FIG. 5, while the fractional delay filter 66 in $3^{rd}$ order may be implemented as shown in FIG. 4. The fractional delay $\alpha$ computation and input sample control unit 68 in FIG. 6 generates the $\alpha$ value for each output sample at a 48 k sampling rate, and it also determines whether to shift s input samples into the delay line of fractional delay filter 66. The operation of unit 68 is based on every 147 input samples generating 80 output samples. In other words, at the transfer of every 80 output samples, the input and output sampling instants are synchronized again.

Let $\alpha_n$ be the delay value at the nth output sample and $s_n$ be the number of input samples shifted into the delay line of fractional delay filter from the data buffer 64. Then, we have:

$$\alpha_n = n\frac{147}{80} - \left\lfloor n\frac{147}{80} \right\rfloor, \quad (7)$$

$$s_n = \left\lfloor n\frac{147}{80} \right\rfloor - \left\lfloor (n-1)\frac{147}{80} \right\rfloor, \quad (8)$$

where n=0,1,2, ... 79 and $\lfloor x \rfloor$ denotes the largest integer but which is less than or equal to x. In order to save MIPS for this application, equations (7) and (8) can be implemented by two look-up tables stored in memory where each table has 80 values. Low pass filter 62 serves to filter the output of the interpolator 60 prior to it entering the data buffer 64. Thus, as shown in FIG. 6, input samples at 44.1 kHz (CD) are up-sampled by two (88.2 kHz) and then passed through a fractional delay filter to yield output samples at 48 kHz (DAT) under the control of the fractional delay $\alpha$ computation and input sample control unit 68, as explained above.

It is to be appreciated that the sample rate conversion apparatus of the invention can also be used for sample rate conversion from DAT to CD with a simple modification of fractional delay $\alpha$ computation and input sample control unit 68. In such an embodiment, the apparatus of the invention generates 147 output samples for every 320 input samples. Hence, equations (7) and (8) are changed to:

$$\alpha_n = n\frac{320}{147} - \left\lfloor n\frac{320}{147} \right\rfloor, \quad (9)$$

$$s_n = \left\lfloor n\frac{320}{147} \right\rfloor - \left\lfloor (n-1)\frac{320}{147} \right\rfloor, \quad (10)$$

where n=0, 1, 2, ..., 146. Accordingly, the methods and apparatus of the invention can be used for sampling rate conversion from DAT to CD without changing filter coefficients.

Figure 7:
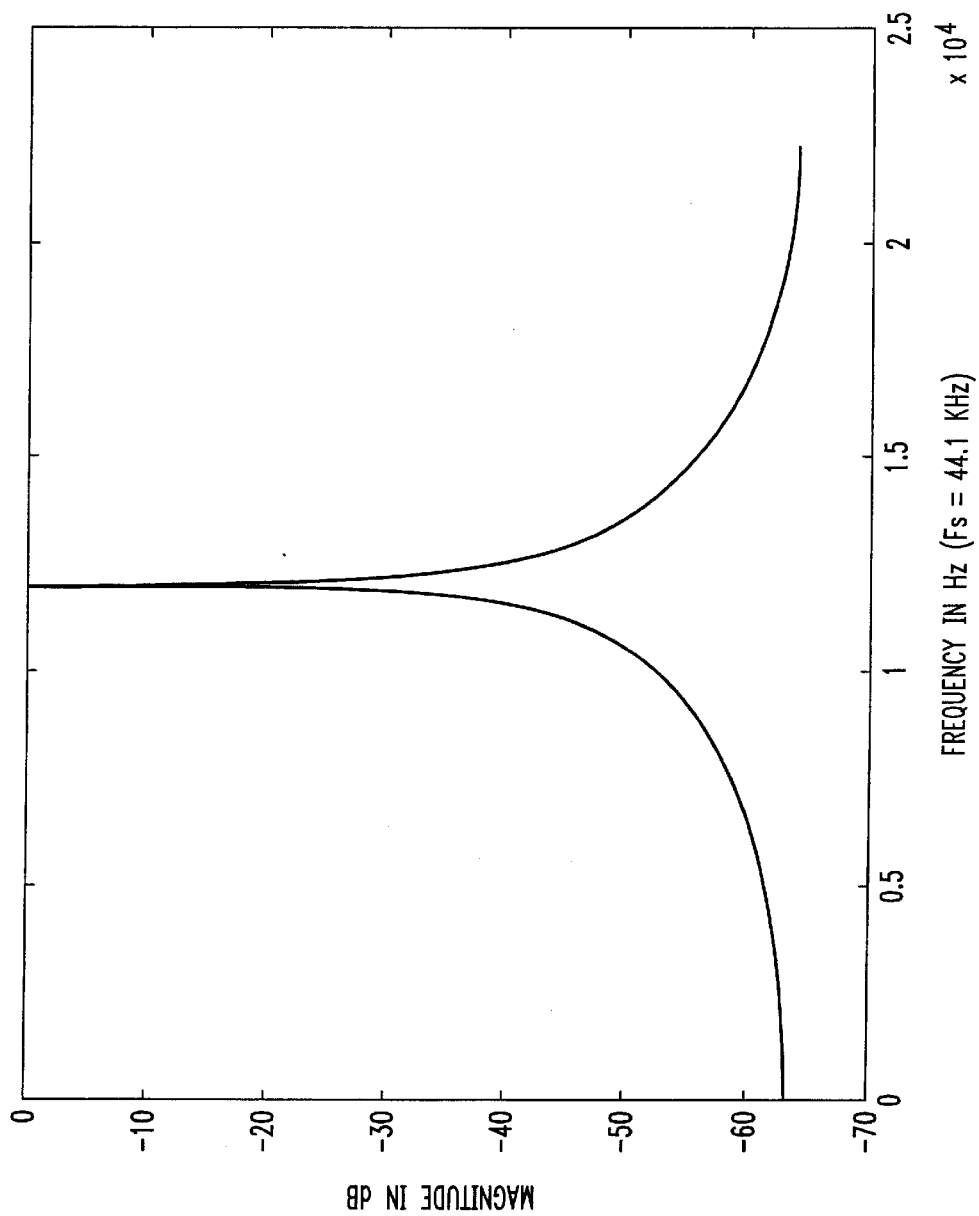
FIG. 7 is a graphical representation of an input CD signal.
Figure 8:
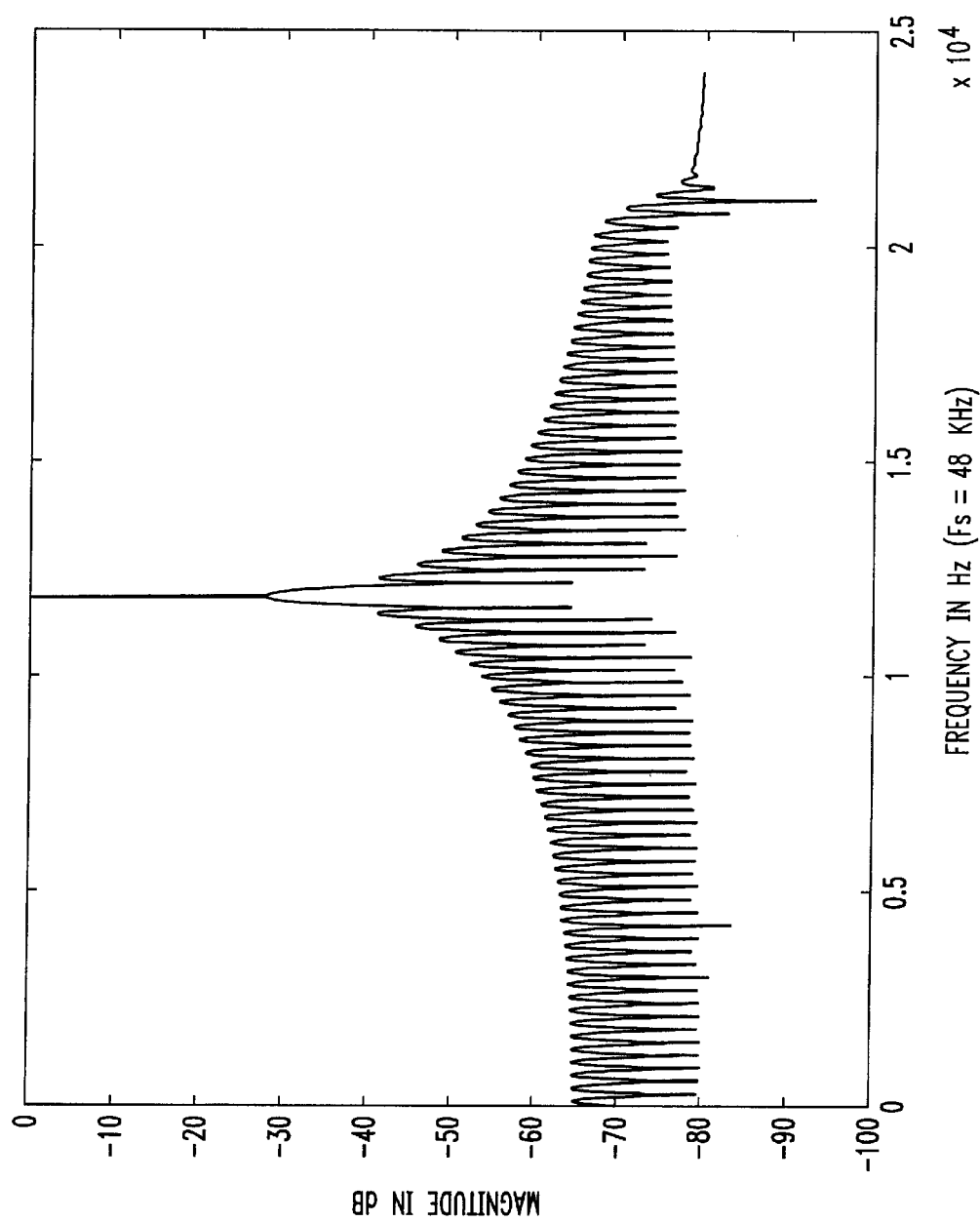
FIG. 8 is a graphical representation of an output DAT signal.

A simulation of CD to DAT sampling rate conversion based on the methodology of the invention described above has been implemented in Matlab. FIGS. 7 and 8 illustrate the CD input signal with a 12K tone and DAT output signal in the frequency domain, respectively. The result shows that the conversion still maintains a very high quality of signal-to-noise ratio at the output signal.

It should be noted that one or more elements, units, or modules of the sample rate conversion apparatus of the invention described herein may be implemented using a central processing unit, microprocessor, application-specific integrated circuit, individual functional circuitry and/or other data processing devices. For example, the apparatus of the invention may be implemented in a real-time DSP with associated memory. Advantageously, it is to be appreciated that the invention requires less memory locations and less MIPS to accomplish sample rate conversion as compared to prior art approaches.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method of converting between a sampling rate associated with a first audio format and a second audio format, the method comprising the steps of:

up-sampling an input signal sampled at the sample rate associated with the first audio format; and filtering the up-sampled signal as a function of a fractional delay to generate an output signal sampled at the sample rate associated with the second audio format, the fractional delay being computed from the sample rates associated with the first and second audio formats.

2. The method of claim 1, wherein the first audio format is a compact disc format and the second audio format is a digital audio tape format.

3. The method of claim 1, further comprising the step of buffering the up-sampled input signal in accordance with a sample control signal prior to the fractional delay filtering step, the sample control signal being computed from the sample rates associated with the first and second audio formats.

4. The method of claim 3, further comprising the step of low-pass filtering the up-sampled signal prior to the buffering step.

5. The method of claim 1, wherein the up-sampling step is by a factor of two.

6. The method of claim 1, wherein the up-sampling step further comprises generating up-sampled odd samples and up-sampled even samples.

7. The method of claim 1, wherein the fractional delay filtering step includes third order six taps coefficient finite impulse response filtering.

8. The method of claim 7, wherein the taps coefficients are a function of the fractional delay.

9. The method of claim 8, wherein the fractional delay is re-computed for each input sample while the tap coefficients are not re-computed for each sample.

10. The method of claim 1, wherein the first audio format is a compact disc format, the second audio format is a digital audio tape format, and the fractional delay for an nth output sample is represented as $$\alpha_n = n\frac{147}{80} - \left\lfloor n\frac{147}{80} \right\rfloor$$

where n=0, 1, 2, ..., 79.

11. The method of claim 10, wherein the up-sampled signal is buffered in accordance with a sample control signal prior to the fractional delay filtering step, the sample control signal being represented as $$s_n = \left\lfloor n\frac{147}{80} \right\rfloor - \left\lfloor (n-1)\frac{147}{80} \right\rfloor$$

where n=0, 1, 2, ..., 79.

12. The method of claim 1, wherein the first audio format is a digital audio tape format, the second audio format is a compact disc format, and the fractional delay for an nth output sample is represented as $$\alpha_n = n\frac{320}{147} - \left\lfloor n\frac{320}{147} \right\rfloor$$

where n=0, 1, 2, ..., 146.

13. The method of claim 12, wherein the up-sampled signal is buffered in accordance with a sample control signal prior to the fractional delay filtering step, the sample control signal being represented as $$s_n = \left\lfloor n\frac{320}{147} \right\rfloor - \left\lfloor (n-1)\frac{320}{147} \right\rfloor$$

where n=0, 1, 2, ..., 146.

14. The method of claim 1, wherein the fractional filtering step is performed by computing $$\sum_{m=0}^{M} \alpha^m z_m$$

where $$z_m = \sum_{k=0}^{N} x(n-k) C_{km}.$$

15. Apparatus for converting between a sampling rate associated with a first audio format and a second audio format, the apparatus comprising:
   at least one processor operative to up-sample an input signal sampled at the sample rate associated with the first audio format, and to filter the up-sampled signal as a function of a fractional delay to generate an output signal sampled at the sample rate associated with the second audio format, the fractional delay being computed from the sample rates associated with the first and second audio formats.

16. The apparatus of claim 15, wherein the first audio format is a compact disc format and the second audio format is a digital audio tape format.

17. The apparatus of claim 15, wherein the processor is further operative to buffer the up-sampled input signal in accordance with a sample control signal prior to the fractional delay filtering operation, the sample control signal being computed from the sample rates associated with the first and second audio formats.

18. The apparatus of claim 17, wherein the processor is further operative to low-pass filter the up-sampled signal prior to the buffering operation.

19. The apparatus of claim 15, wherein the up-sampling operation is by a factor of two.

20. The apparatus of claim 15, wherein the up-sampling operation includes generating up-sampled odd samples and up-sampled even samples.

21. The apparatus of claim 15, wherein the fractional delay filtering operation includes third order six taps coefficient finite impulse response filtering.

22. The apparatus of claim 21, wherein the taps coefficients are a function of the fractional delay.

23. The apparatus of claim 22, wherein the fractional delay is re-computed for each input sample while the tap coefficients are not re-computed for each sample.

24. The apparatus of claim 15, wherein the first audio format is a compact disc format, the second audio format is a digital audio tape format, and the fractional delay for an nth output sample is represented as $$\alpha_n = n\frac{147}{80} - \left\lfloor n\frac{147}{80} \right\rfloor$$

where n=0, 1, 2, ..., 79.

25. The apparatus of claim 24, wherein the up-sampled signal is buffered in accordance with a sample control signal prior to the fractional delay filtering operation, the sample control signal being represented as $$s_n = \left\lfloor n\frac{147}{80} \right\rfloor - \left\lfloor (n-1)\frac{147}{80} \right\rfloor$$

where n=0, 1, 2, ..., 79.

26. The apparatus of claim 15, wherein the first audio format is a digital audio tape format, the second audio format is a compact disc format, and the fractional delay for an nth output sample is represented as $$\alpha_n = n\frac{320}{147} - \left\lfloor n\frac{320}{147} \right\rfloor$$

where n=0, 1, 2, ..., 146.

27. The apparatus of claim 26, wherein the up-sampled signal is buffered in accordance with a sample control signal prior to the fractional delay filtering operation, the sample control signal being represented as $$s_n = \left\lfloor n\frac{320}{147} \right\rfloor - \left\lfloor (n-1)\frac{320}{147} \right\rfloor$$

where n=0, 1, 2, ..., 146.

28. The apparatus of claim 15, wherein the fractional filtering operation is performed by computing $$\sum_{m=0}^{M} \alpha^m z_m$$

where $$z_m = \sum_{k=0}^{N} x(n-k) C_{km}.$$

29. Apparatus for converting between a sampling rate associated with a first audio format and a second audio format, the apparatus comprising:
   an interpolator which up-samples an input signal sampled at the sample rate associated with the first audio format; and
   a fractional delay filter coupled to the interpolator which filters the up-sampled signal as a function of a fractional delay to generate an output signal sampled at the sample rate associated with the second audio format, the fractional delay being computed from the sample rates associated with the first and second audio formats.

* * * * *